(12) United States Patent
Girdhar et al.

(10) Patent No.: US 8,148,815 B2
(45) Date of Patent: Apr. 3, 2012

(54) STACKED FIELD EFFECT TRANSISTOR CONFIGURATIONS

(75) Inventors: Dev A. Girdhar, Indialantic, FL (US);
Thomas A. Jochum, Durham, NC (US);
Bogdan M. Duduman, Raleigh, NC (US)

(73) Assignee: Intersil Americas, Inc., Milpitas, CA (US)

( * ) Notice: Subject to any disclaimer, the term of this patent is extended or adjusted under 35 U.S.C. 154(b) by 462 days.

(21) Appl. No.: 12/424,686

(22) Filed: Apr. 16, 2009

(65) Prior Publication Data

US 2010/0090668 A1    Apr. 15, 2010

Related U.S. Application Data

(60) Provisional application No. 61/104,784, filed on Oct. 13, 2008.

(51) Int. Cl.
*H01L 23/24* (2006.01)

(52) U.S. Cl. .......................... 257/724; 257/723

(58) Field of Classification Search ........... 257/E23.044, 257/20, 723, 686, 670, 712, 713, 690, 691, 257/589, 678, 688, E21.336, 724; 361/706, 361/777, 723; 438/728, 268, 106, 462; 323/282–288
See application file for complete search history.

(56) References Cited

U.S. PATENT DOCUMENTS

| | | | |
|---|---|---|---|
| 6,031,279 A * | 2/2000 | Lenz | 257/686 |
| 6,812,782 B2 | 11/2004 | Grant | |
| 6,870,352 B2 * | 3/2005 | Walters et al. | 323/277 |
| 6,975,494 B2 * | 12/2005 | Tang et al. | 361/64 |
| 7,271,470 B1 * | 9/2007 | Otremba | 257/666 |
| 7,459,750 B2 | 12/2008 | Ludikhuize | |
| 7,618,896 B2 * | 11/2009 | Joshi et al. | 438/728 |
| 7,757,392 B2 * | 7/2010 | Otremba | 29/840 |
| 8,089,147 B2 * | 1/2012 | Pavier et al. | 257/724 |
| 2003/0098468 A1 | 5/2003 | Wheeler et al. | |
| 2005/0179472 A1 | 8/2005 | Nakamura et al. | |
| 2005/0280163 A1 | 12/2005 | Schaffer et al. | |
| 2006/0231904 A1 | 10/2006 | Kocon | |
| 2007/0158778 A1 | 7/2007 | Kitabatake et al. | |
| 2007/0249092 A1 | 10/2007 | Joshi et al. | |
| 2008/0023785 A1 | 1/2008 | Hebert | |
| 2008/0023825 A1 | 1/2008 | Hebert et al. | |
| 2008/0024102 A1 | 1/2008 | Hebert et al. | |
| 2009/0039394 A1 | 2/2009 | Uno et al. | |
| 2009/0057869 A1 | 3/2009 | Hebert et al. | |

(Continued)

FOREIGN PATENT DOCUMENTS

KR    20050085461    8/2005

(Continued)

*Primary Examiner* — Rajnikant Patel
(74) *Attorney, Agent, or Firm* — Fogg & Powers LLC

(57) ABSTRACT

An improved organization for a MOSFET pair mounts first and second FET dies in an overlying or stacked relationship to reduce the surface area 'footprint' of the MOSFET pair. The source and drain of a high side $FET_{high}$ and a low side $FET_{low}$ or the drains of the respective high side $FET_{high}$ and low side $FET_{low}$ are bonded together, either directly or through an intermediate conductive ribbon or clip, to establish a common source/drain or drain/drain node that functions as the switch or phase node of the device. The stacked organization allows for lower-cost packaging that results in a significant reduction in the surface area footprint of the device and reduces parasitic impedance relative to the prior side-by-side organization and allows for improved heat sinking.

37 Claims, 6 Drawing Sheets

U.S. PATENT DOCUMENTS

| | | |
|---|---|---|
| 2009/0072368 A1 | 3/2009 | Hu et al. |
| 2009/0263947 A1 | 10/2009 | Hebert |
| 2010/0133644 A1 | 6/2010 | Hebert |
| 2010/0140693 A1 | 6/2010 | Hebert |
| 2010/0155837 A1 | 6/2010 | Hebert |
| 2010/0155915 A1 | 6/2010 | Bell et al. |

FOREIGN PATENT DOCUMENTS

| | | |
|---|---|---|
| WO | 2004054078 | 6/2004 |

* cited by examiner

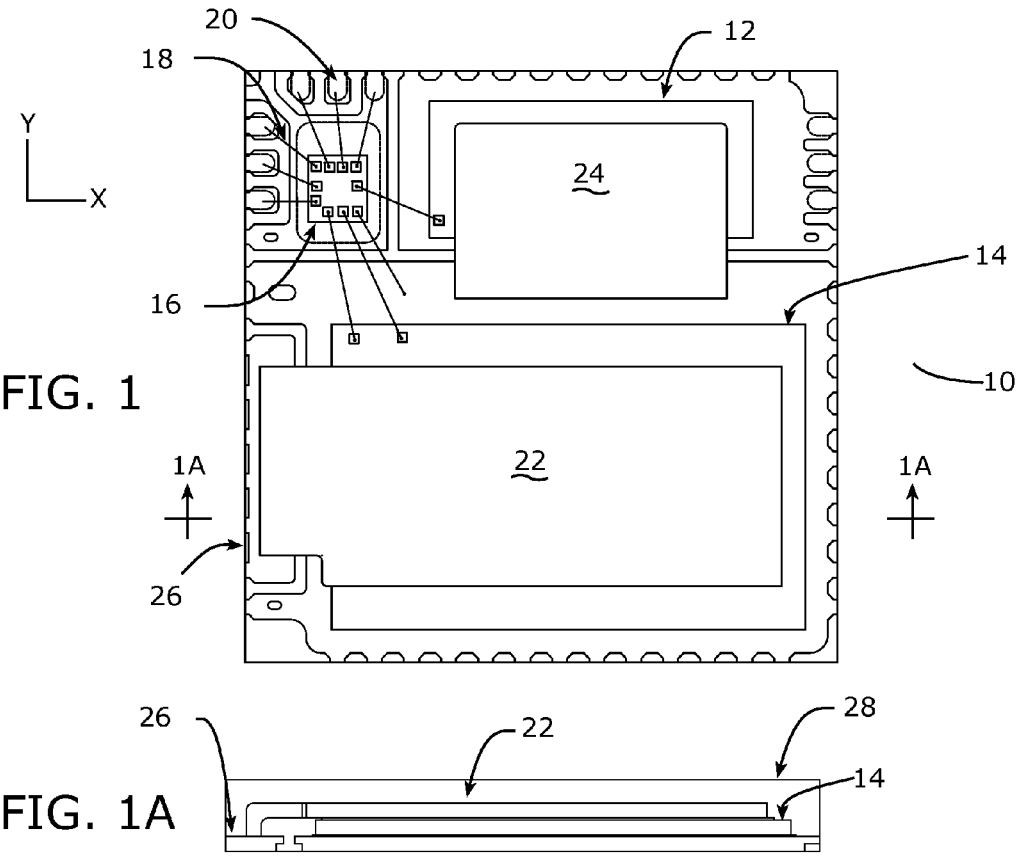
FIG. 1
FIG. 1A
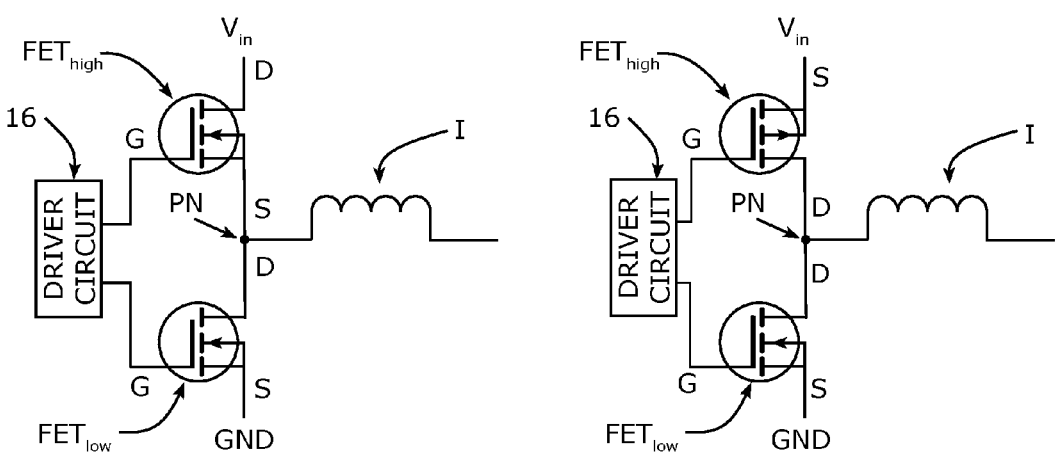
FIG. 1B
FIG. 1C

US 8,148,815 B2

STACKED FIELD EFFECT TRANSISTOR CONFIGURATIONS

CROSS-REFERENCE TO RELATED APPLICATION

This application claims the benefit of U.S. Provisional Patent Application 61/104,784 filed by the inventors herein on Oct. 13, 2008, the disclosure of which is incorporated herein by reference.

BACKGROUND

The present invention relates to the structural organization of MOSFET pairs and, more particularly, to MOSFET pairs having reduced PCB mounting area requirements, increased thermal efficiency, and reduced parasitic impedances.

Multi-die packaging is common in power converters in which MOSFET switching transistors are used; for example and as shown in FIGS. 1 and 1A, a circuit assembly or package 10 includes a first FET 12 and a second FET 14 in a side-by-side or lateral mounting arrangement on a common plane with a controller or driver chip 16 that is connected via bonding wires 18 between conductive pads (unnumbered) on the driver chip 16 and to contacts 20 of the respective leadframe portions and by bonding wires 18 connected to various contact pads (unnumbered) on the FET structures. A first strap or clip 22, typically formed from shape-sustaining copper or a copper alloy in ribbon or ribbon-like form, is in electrical and thermal contact with the upper surface of the FET 14 and a second clip 24 is in electrical and thermal contact with the upper surface of the FET 12. As shown in FIG. 1A, the first clip 24 is generally "L-shaped" and includes a columnar portion (unnumbered) that is in contact with a contact pad 26 of the leadframe; the clip 24 is similarly shaped and is in contact with another portion (unnumbered) of the leadframe. In typical power converter operations, the clips 22 and 24 serve as substantial current carrying conductors as well as heat sinks. While not specifically shown, the various parts are electrically connecting using solder-bonding techniques. As shown in FIG. 1A at 28, the structure of FIG. 1 is typically encapsulated in a thermosetting molding compound to define a circuit package.

The MOSFET package shown in FIGS. 1 and 1A finds use in power switching applications including use in synchronous buck converter circuits of the type shown in FIGS. 1B and 1C. In FIG. 1B, two n-channel MOSFETs, $FET_{high}$ and $FET_{low}$, are in series circuit between $V_{in}$ and ground GND with a switching or phase node PN defined between the source S of $FET_{high}$ and the drain D of $FET_{low}$. The drain D of $FET_{high}$ is connected to $V_{in}$ while the source S of $FET_{low}$ is connected to ground. The two FETs are alternatively turned on and off by respective on/off pulses of appropriate pulse width and timing from a driver circuit 16 to their gates G to step-down $V_{in}$ into an inductor I. The circuit of FIG. 1C is similar to that of FIG. 1B except that the high-side FET is a p-channel MOSFET with its drain D connected to the drain D of $FET_{low}$ to define the phase node PN; in FIG. 1C, the $FET_{high}$ and $FET_{low}$ are alternatively turned on and off by respective pulses of appropriate pulse width and timing to their gates G from a driver circuit 16 to switch $V_{in}$ into an inductor I. The inductor I can take the form of a planar spiral inductor formed on a substrate or a discrete inductor package. While not specifically shown, the side of the inductor I opposite to that connected to the phase node PN can be connected to one or more capacitors (and/or inductors) to smooth or otherwise condition the output.

The physical organization of FIG. 1 functions for its intended purpose; however, the side-by-side organization of FIG. 1 militates against more compact circuit packages occupying smaller circuit board areas.

SUMMARY

A MOSFET pair suited for use in a synchronous buck converter places the FET dies in a stacked relationship to reduce the surface area 'footprint'; depending upon the electrical circuit used, the source and drain of the two FETs or the drains of the two FETs are connected together, either directly or through an intermediate conductive ribbon, strap, or clip, to establish a common phase or switch node. The stacked organization allows for lower-cost packaging that results in a significant reduction in the surface area footprint of the device and reduces parasitic impedance relative to prior side-by-side organizations while allowing for improved heat sinking.

BRIEF DESCRIPTION OF THE DRAWING

FIG. 1 is a plan view of a representative or example multi-die assembly in which two MOSFET structures are mounted adjacent one another in a common plane;

FIG. 1A is a cross-sectional view of the structure of FIG. 1 taken along line 1A-1A of FIG. 1;

FIG. 1B is a simple circuit diagram of two n-channel enhancement-mode MOSFETs in a synchronous buck-convertor configuration;

FIG. 1C is a simple circuit diagram of an n-channel and a p-channel enhancement-mode MOSFET in a synchronous buck-convertor configuration;

DESCRIPTION OF THE PREFERRED EMBODIMENTS

Figure 2A:
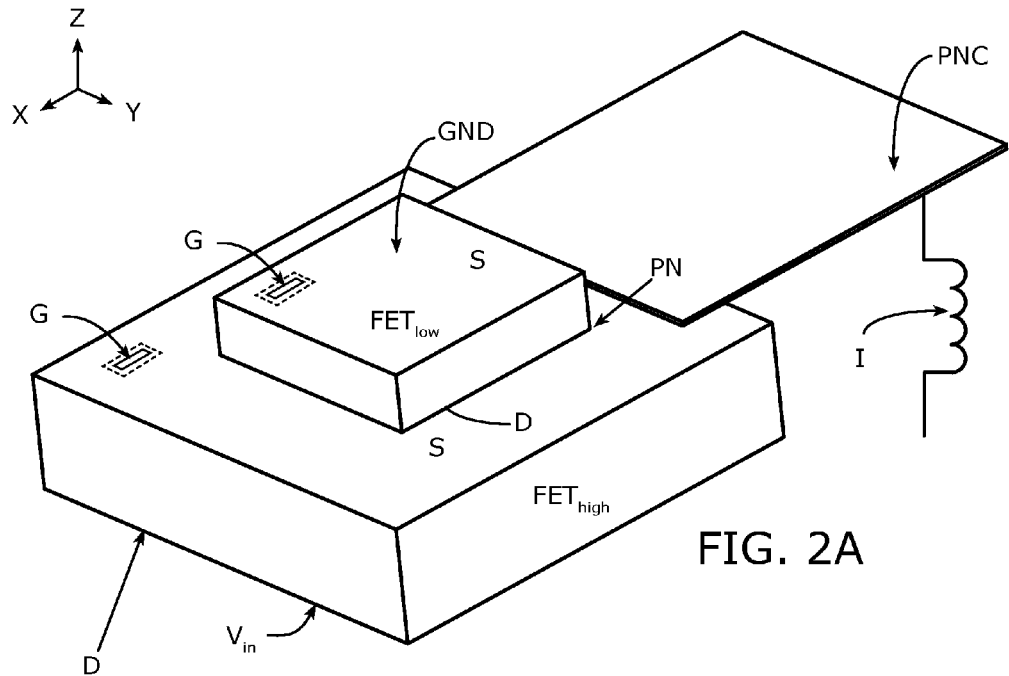
FIGS. 2A and 2B are an example of a first stacked FET organization.
Figure 2B:
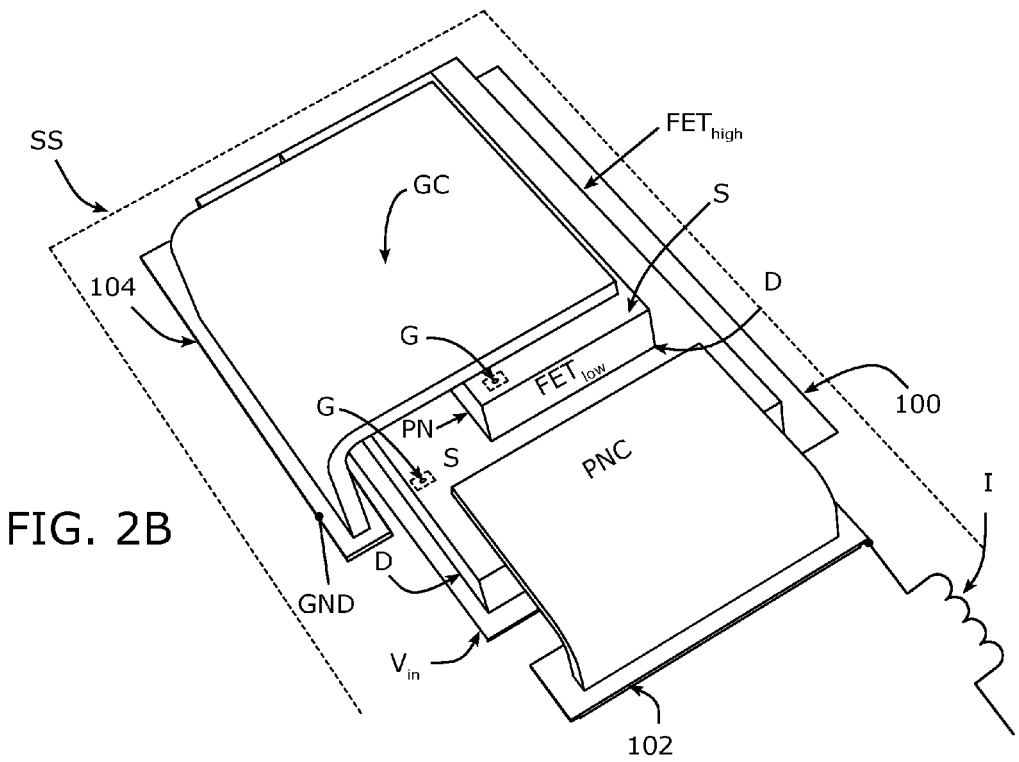
Figure 2C:
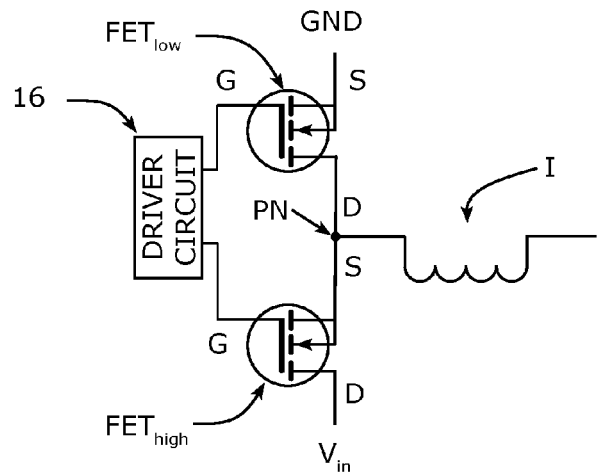
FIG. 2C is an simple circuit diagram representing the physical organization of FIGS. 2A and 2B.

FIG. 2A is an idealized symbolic representation of a first MOSFET organization in which NMOS FETs are used for both the high side FET and the low side FET, and FIG. 2B is a representative pictorial representation of one possible embodiment of the representation of FIG. 2A with the corresponding electrical circuit shown in FIG. 2C. In both FIGS. 2A and 2B, the two FETs are shown in symbolic or idealized fashion as right parallelepipeds each having major surface-area upper and lower surfaces with the smaller-volume parallelepiped mounted on top of or stacked upon the larger-volume parallelepiped; in practice, actual FET structures are somewhat differently shaped and have different sizing and thicknesses from that illustrated depending upon the manufacturing process and design constraints. The FETs shown are vertical FETs and can be characterized as having an upper or top region or surface (which can constitutes a source or drain contact), a lower or bottom region or surface (which can constitute a drain or a source contact), and an intermediate region therebetween through which a controllable current can flow as a function of gate control signals applied to a gate electrode.

In FIG. 2A, a high side $FET_{high}$ includes source S, drain D, and gate G contacts and is mounted in a bottom drain/top source orientation on an underlying die pad (not shown in FIG. 2A) connected to a $V_{in}$ trace on the underlying printed circuit board; the die pad is typically part of a larger leadframe. The low side $FET_{low}$ is also in a bottom drain/top source orientation with the drain D of the low side $FET_{low}$ mounted upon and electrically connected or bonded (i.e., solder bonded) to the source S surface of high side $FET_{high}$ to define the phase node PN therebetween. The phase node PN is then connected to an inductor I using a shape-sustaining clip (generally indicated as PNC), conductive ribbon, or strap. As is also known, the connection to the phase node can be implemented by a plurality of bonding wires (not shown). The source S of low side $FET_{low}$ is wire bonded or otherwise connected to a ground trace on the PCB. The gates G of the high side $FET_{high}$ and the low side $FET_{low}$ are wire bonded to their respective driver (not shown in FIG. 2A of which the driver 16 of FIG. 1 is suitable) to allow the high side $FET_{high}$ and the low side $FET_{low}$ to be alternately turned on and off by appropriately timed and spaced pulses to the gates G of both the high side $FET_{high}$ and the low side $FET_{low}$. In FIG. 2A, the high side $FET_{high}$ is larger than the low side $FET_{low}$ as is the case where the ratio of $V_{out}/V_{in}$ is >0.5.

FIG. 2B is representative of one possible physical or package organization of the arrangement of FIG. 2A using conductive clips; as shown, the bottom-drain high side $FET_{high}$ is mounted upon and electrically connected or bonded to a die pad 100 of an underlying substrate SS (shown generically in dotted-line), which can take the form of leadframe (not fully shown), a substrate pad (not shown), or an underlying printed circuit board (not shown) to connect the drain D to a $V_{in}$ trace or other $V_{in}$ source. The drain D of the low side $FET_{low}$ is mounted upon and electrically connected or bonded to the source S surface of high side $FET_{high}$ to define the phase node PN therebetween. An L-shaped conductive clip PNC is in electrical contact with or electrically bonded to the phase node PN via an electrical connection to the source S surface of high side $FET_{high}$ and has an columnar portion in contact with another contact pad 102 of the underlying leadframe (or other suitable substrate). In this organization, the contact pad 102 is then connected to an inductor I, which can take the form of a planar inductor or a discrete inductor mounted on the printed circuit board (not specifically shown). Another L-shaped conductive clip GC is in contact with the source S of low side $FET_{low}$ and has a columnar portion in contact with another contact pad 104 of the underlying leadframe (or printed circuit board) which, in turn, is connected to circuit ground GND. The gates G of the high side $FET_{high}$ and the low side $FET_{low}$ are wire bonded to their respective driver (not shown in FIG. 2B of which the driver 16 of FIG. 1 is an example) to allow the high side $FET_{high}$ and the low side $FET_{low}$ to be alternately turned on and off by pulses of appropriate pulse width and timing applied to their respective gates G. While not specifically shown, those surfaces of the FETs that are electrically connected to other components can be solder-bonded using solder paste/reflow techniques.

FIG. 2C illustrates the equivalent electrical circuit for the physical organization of FIGS. 2A and 2B showing the drain D of the side $FET_{low}$ and the source S of the high side $FET_{high}$ connected to the inductor I via the phase node PN with the source S of the low side $FET_{low}$ connected to ground GND and the drain D of the high side $FET_{high}$ connected to $V_{in}$. The driver circuit 16 provides a succession of alternating on/off pulses of appropriate pulse width and timing to the gates G of $FET_{high}$ and $FET_{low}$ to turn the FETs on and off. The inductor I can take the form of a substantially planar spiral conductive path formed on a substrate or a discrete inductor device. While not specifically shown, the side of the inductor I opposite to that connected to the phase node PN can be connected to one or more capacitors and/or inductors to smooth or otherwise condition the output.

Figure 3A:
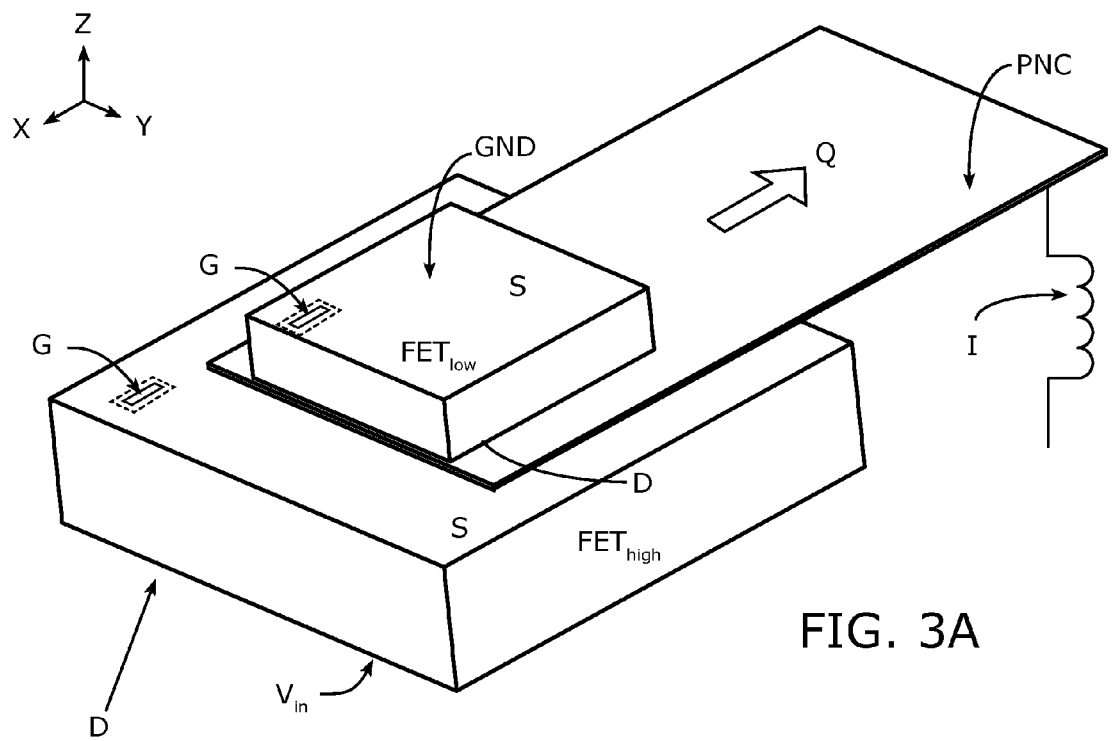
FIGS. 3A and 3B represent a variation of the stacked FET organization of FIGS. 2A and 2B.
Figure 3B:
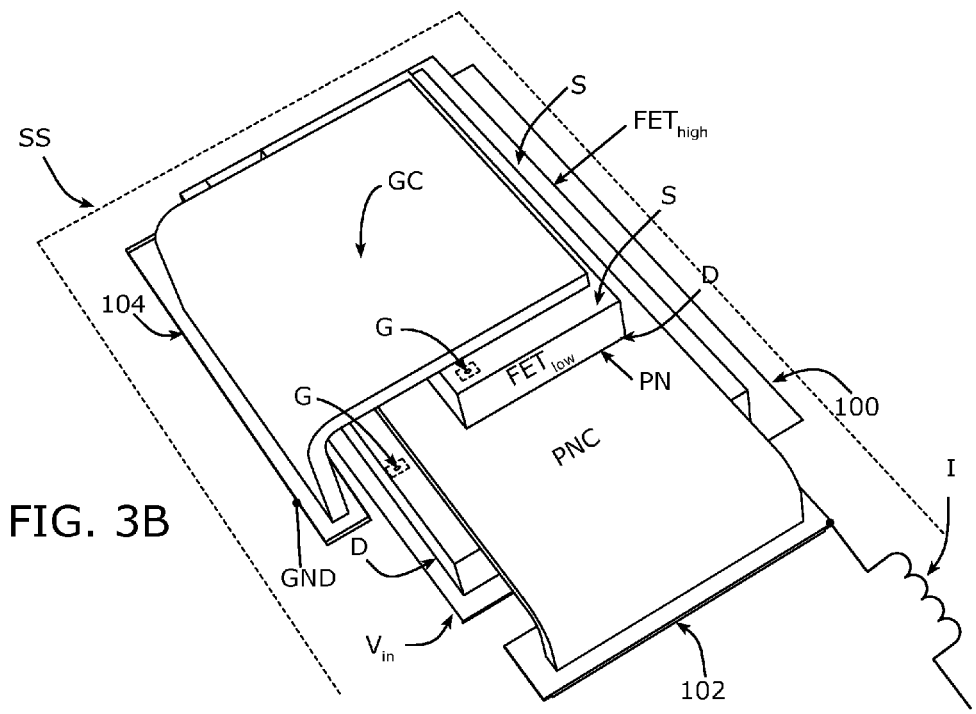

FIGS. 3A and 3B represent a variation of the arrangement and organization of FIGS. 2A and 2B and shows the conductive clip PNC fully interposed between and electrically connected or bonded to the drain D of the low side $FET_{low}$ and the source S of the high side $FET_{high}$. The FIG. 3A arrangement maximizes the electrical contact area and the heat transfer area at the phase node PN between the drain D of the low side $FET_{low}$ and the source S of the high side $FET_{high}$ to maximize heat sinking, as indicated symbolically at Q. While a fully interposed conductive clip PNC is preferred, other arrangements in which the conductive clip PNC does not fully extend between the surface of the FETs is also acceptable.

Figure 4:
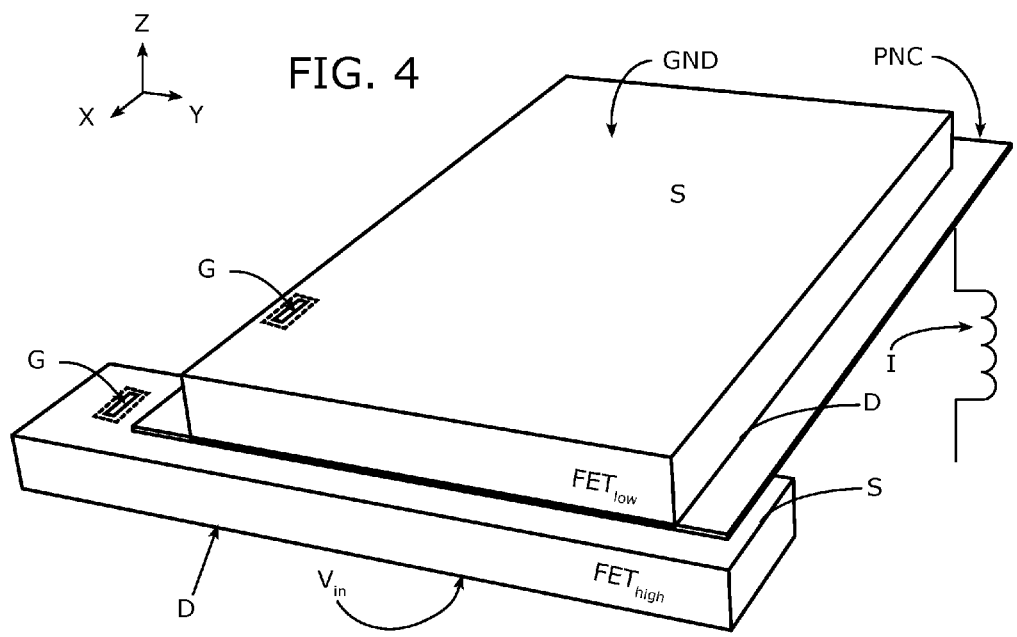
FIG. 4 is another example a stacked FET organization.

FIG. 4 illustrates an embodiment better suited for use where the ratio of $V_{out}/V_{in}$ is <0.5 where the low side $FET_{low}$ is normally volumetrically larger than the high side $FET_{high}$; the physical organization of FIG. 4 is electrically the same as that of FIGS. 2A-2C. In FIG. 4, the high side $FET_{high}$ is arranged in a bottom drain/top source organization and formed as a strip-like parallelepiped having a source S and drain D with a gate G shown to the left. The larger volume, bottom drain/top source low side $FET_{low}$ is positioned above the high side $FET_{high}$ with a conductive clip PNC (fabricated from a shape-sustaining copper or copper-alloy material) interposed between and electrically connected to or electrically bonded to the source S of the high side $FET_{high}$ and the drain D of low side $FET_{low}$ with the conductive clip PNC extending across the surface of the low side $FET_{low}$ that defines the drain D to connect to the inductor I. The conductive clip PNC can be also be shaped as an L-shaped component in a manner consistent with FIG. 3B.

Figure 5A:
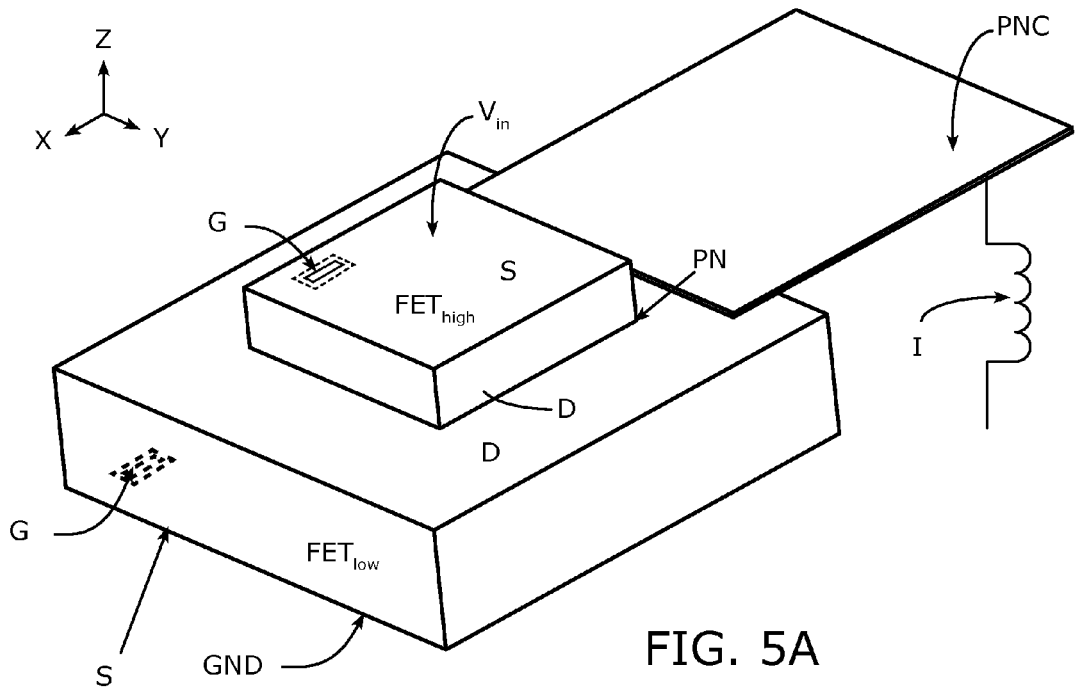
FIG. 5A is further example a stacked FET organization.

FIG. 5A represents a physical organization similar to that of FIGS. 2A and 3A but in which a bottom drain/top source p-channel MOSFET functions as the high side $FET_{high}$ and a bottom source/top drain n-channel MOSFET functions as the low side $FET_{low}$ in a manner electrically consistent with FIG. 1C.

Figure 5B:
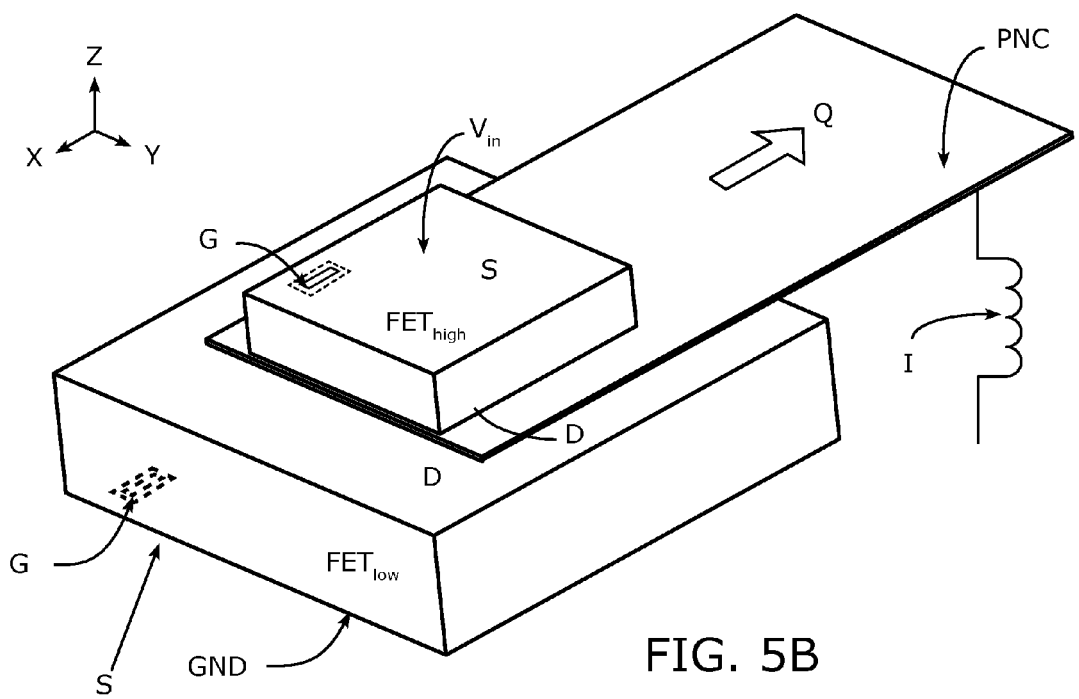
FIG. 5B is a variation of the stacked FET organization of FIG. 5A.

As shown in FIG. 5A, the source S of the low side $FET_{low}$ connects to ground with its gate G isolated therefrom. The drain D of the low side $FET_{low}$ electrically connects to the drain D of the high side $FET_{high}$ to define the phase node PN therebetween. The source S of the high side $FET_{high}$ is connected to $V_{in}$ with a phase node connector PNC electrically connected or bonded to the drain D of the low side $FET_{low}$ to connect the phase node PN to the inductor I. As in the case of the FIG. 2A embodiment, the gates G of the high side $FET_{high}$ and the low side $FET_{low}$ are wire bonded to their respective drivers (not shown) to allow the high side $FET_{high}$ and the low side $FET_{low}$ to be alternately turned on and off by pulses of appropriate duration and timing applied to their respective gates. In the embodiment of FIG. 5B, the phase node connector PNC is interposed between and electrically connected or bonded to the drain D of the low side $FET_{low}$ and the drain D of the high side $FET_{high}$.

Figure 5C:
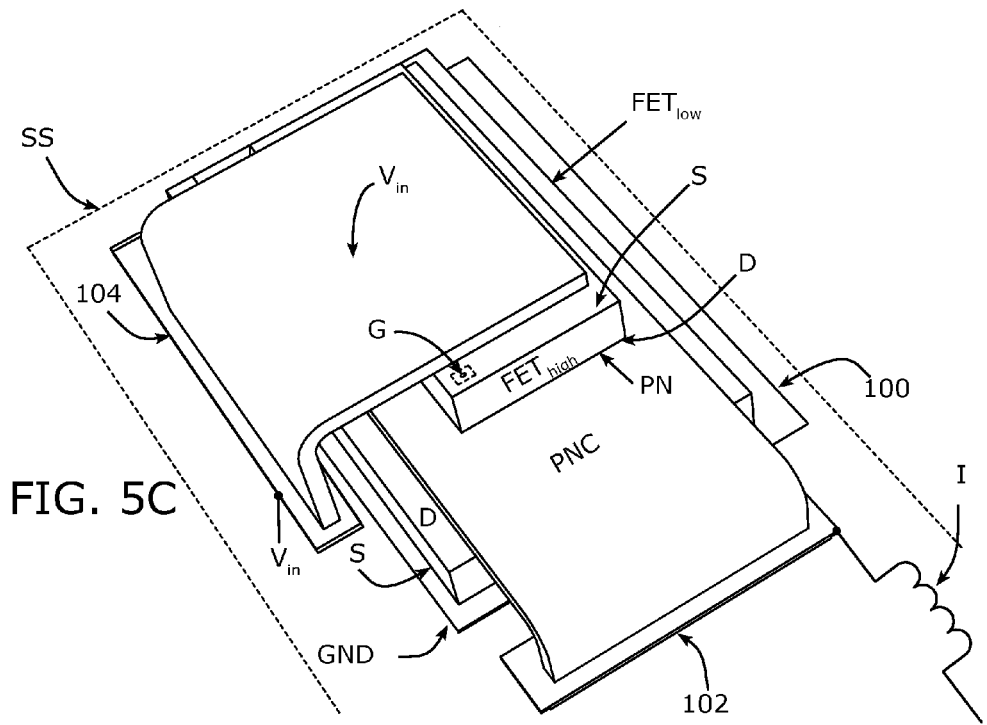
FIG. 5C is representative physical representation of the organization of FIG. 5B.

The arrangements of FIGS. 5A and 5B can be configured, as one possible physical organization, in a manner consistent with that of FIGS. 2B and 3B. For example and as shown in FIG. 5C, the low side $FET_{low}$ is mounted upon a contact pad 100 of an underlying leadframe (not fully shown), a substrate (not shown), or an underlying printed circuit board (not shown) with its source S connected a ground trace. An L-shaped conductive clip PNC is positioned intermediate the drain D of the low side $FET_{low}$ and the drain D of the high side $FET_{high}$ to define the phase node PN. The conductive clip PNC has a columnar portion in contact with another contact pad 102 of the underlying leadframe (or printed circuit board). In this organization, the contact pad 102 is then connected to an inductor I, which can take the form of a planar inductor or a discrete inductor mounted on the printed circuit board (not specifically shown). Another L-shaped conductive clip $V_{in}$ C is in contact with the source S of high side $FET_{high}$ and has an columnar portion in contact with another contact pad 104 of the underlying leadframe (or printed circuit board) which is in contact with a $V_{in}$ source. The gates G of the high side $FET_{high}$ is wire bonded to its respective driver contact (not shown in FIG. 5C of which the driver 16 of FIG. 1 is an example). In FIG. 5C, the gate of the low side $FET_{low}$ is not shown and is located on the underside of the $FET_{low}$ facing the contact pad 100; in this case, an appropriately sized opening (not shown) is formed in the contact pad 100 to allow access the gate G of the low side $FET_{low}$. In FIG. 5C, the conductive clip PNC is fully interposed between the $FET_{high}$ and the $FET_{low}$; if desired a conductive clip of the type shown in FIG. 2B can also be used.

Figure 6:
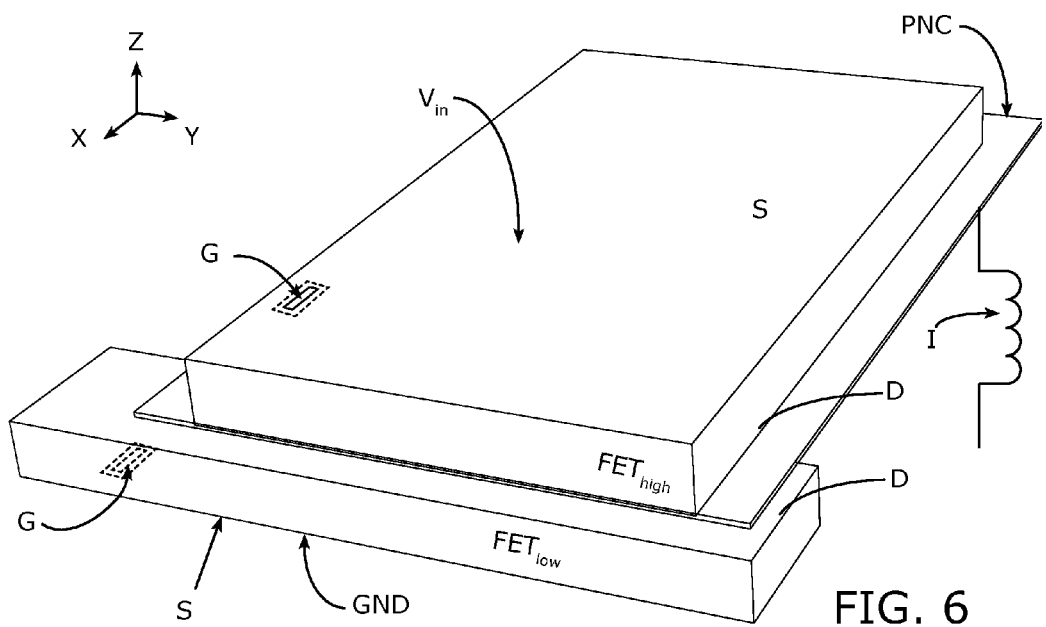
FIG. 6 is further example a stacked FET organization.

FIG. 6 illustrates an embodiment well suited for use where the ratio of $V_{out}/V_{in}$ is >0.5 where the low side $FET_{low}$ is normally volumetrically smaller than the high side $FET_{high}$; the physical organization of FIG. 6 is electrically the same at that of FIG. 1C, described above. In FIG. 6, the low side $FET_{low}$ is formed as a strip-like parallelepiped having a source S and drain D with a gate G shown to the left. The larger volume high side $FET_{high}$ is positioned above the low side $FET_{low}$ with a conductive clip PNC (fabricated from a shape-sustaining copper or copper-alloy material) interposed between the drain D of the high side $FET_{high}$ and the drain D of low side $FET_{low}$ with the conductive clip PNC extending across the surface of the high side $FET_{high}$ that defines the drain D to connect to the inductor I.

The stacked organization described herein allows for lower-cost packaging that results in a significant reduction in the surface area footprint of the device and reduces parasitic impedance relative to the prior side-by-side organization and allows for improved heat sinking.

As will be apparent to those skilled in the art, various changes and modifications may be made to the illustrated embodiment of the present invention without departing from the spirit and scope of the invention as determined in the appended claims and their legal equivalent.

The invention claimed is:

1. A dual vertical-MOSFET organization, comprising:
   a first vertical MOSFET having at least a first major surface area thereof defining a drain contact surface and having a second major surface area thereof defining a source contact surface and having a gate contact for controlling current conduction in said first MOSFET in response to a gate control voltage applied to said gate contact of said first MOSFET,
   a second vertical MOSFET having at least a first major surface area thereof defining a drain contact surface and having a second major surface area thereof defining a source contact surface and having a gate contact for controlling current conduction in said second MOSFET in response to a gate control voltage applied to said gate contact of said second MOSFET, the first major surface area of said second MOSFET mounted in a conductive relationship on said second major surface of said first MOSFET to define a circuit node thereat; and
   a conductive clip electrically connected to said circuit node.

2. The dual vertical-MOSFET organization of claim 1, wherein the first major surface area of said second MOSFET and said second major surface of said first MOSFET are mounted in a surface-to-surface conductive relationship to define said circuit node thereat.

3. The dual vertical-MOSFET organization of claim 2, wherein the first major surface area of said second MOSFET is smaller than said second major surface of said first MOSFET, said conductive clip electrically connected to a portion of the second surface area of said first MOSFET not occupied by said first MOSFET.

4. The dual vertical-MOSFET organization of claim 1, wherein the first major surface area of said second MOSFET is conductively mounted on a surface area portion of said conductive clip and said second major surface of said first MOSFET is conductively mounted to another surface area portion of said conductive clip; said conductive clip defining said circuit node thereat.

5. The dual vertical-MOSFET organization of claim 4, wherein the first major surface area of said second MOSFET is larger in surface area than that of the second major surface area of said first MOSFET.

6. The dual vertical-MOSFET organization of claim 1, wherein both said first and second MOSFETs are n-type MOSFETs.

7. A dual vertical-MOSFET organization, comprising:
   a first vertical MOSFET having at least a first major surface area thereof defining a source contact surface and having a second major surface area thereof defining a drain contact surface and having a gate contact for controlling current conduction in said first MOSFET in response to a gate control voltage applied to said gate contact of said first MOSFET;
   a second vertical MOSFET having at least a first major surface area thereof defining a drain contact surface and having a second major surface area thereof defining a source contact surface and having a gate contact for controlling current conduction in said second MOSFET in response to a gate control voltage applied to said gate contact of said second MOSFET, the first major surface area of said second MOSFET mounted in a conductive relationship with said second major surface of said first MOSFET to define a circuit node thereat;
   wherein the first major surface area of the second MOSFET has a different surface area than the second major surface area of the first MOSFET; and
   a conductive clip electrically connected to said circuit node.

8. The dual vertical-MOSFET organization of claim 7, wherein the first major surface area of said second MOSFET and said second major surface of said first MOSFET are mounted in a surface-to-surface conductive relationship to define said circuit node thereat.

9. The dual vertical-MOSFET organization of claim 8, wherein the first major surface area of said second MOSFET is smaller than said second major surface of said first MOSFET, said conductive clip electrically connected to a portion of the second surface area of said first MOSFET not occupied by said second MOSFET.

10. The dual vertical-MOSFET organization of claim 7, wherein the first major surface area of said second MOSFET is conductively mounted on a surface area portion of said conductive clip and said second major surface of said first MOSFET is conductively mounted to a smaller surface area portion of said conductive clip under the conductive clip such that the second MOSFET rests on a portion of the conductive clip that extends outwardly from and parallel to the second major surface area of the first MOSFET; said
   conductive clip defining said circuit node thereat.
   11. The dual vertical-MOSFET organization of claim 10, wherein the first major surface area of said second MOSFET is larger in surface area than that of the second major surface area of said first MOSFET.
   12. The dual vertical-MOSFET organization of claim 7, wherein said first MOSFET is an n-type MOSFET and said second MOSFETs is a p-type MOSFET.
   13. A buck converter circuit organization, comprising:
   a first vertical MOSFET having at least a first major surface area thereof defining a drain contact surface and having a second major surface area thereof defining a source contact surface and having a gate contact for controlling current conduction in said first MOSFET in response to a gate control voltage applied to said gate contact of said first MOSFET;
   the first major surface area of said first MOSFET connected to a voltage source $V_{in}$;
   a second vertical MOSFET having at least a first major surface area thereof defining a drain contact surface and having a second major surface area thereof defining a source contact surface connected to a circuit ground and having a gate contact for controlling current conduction in said second MOSFET in response to a gate control voltage applied to said gate contact of said second MOSFET, the first major surface area of said second MOSFET mounted in a conductive, stacked relationship with said second major surface of said first MOSFET to define a circuit node thereat;
   a conductive clip electrically connected to said circuit node, said conductive clip electrically connectable to a load via at least an inductive impedance; and
   a driver circuit connected to said gate contact of said first MOSFET and connected to said gate contact of said second MOSFET for providing pulses of selected timing and pulse width to the respective gate contacts of said first and second MOSFETs to control the voltage at said circuit node.
   14. The buck converter circuit organization of claim 13, wherein the first major surface area of said second MOSFET and said second major surface of said first MOSFET are mounted in a surface-to-surface conductive relationship to define said circuit node thereat.
   15. The buck converter circuit organization of claim 14, wherein the first major surface area of said second MOSFET is smaller than said second major surface of said first MOSFET, said conductive clip electrically connected to a portion of the second surface area of said first MOSFET not occupied by said second MOSFET.
   16. The buck converter circuit organization of claim 13, wherein the first major surface area of said second MOSFET is conductively mounted on a surface area portion of said conductive clip and said second major surface of said first MOSFET is conductively mounted to another surface area portion of said conductive clip;
   said conductive clip defining a circuit node thereat.
   17. The buck converter circuit organization of claim 13, wherein the first major surface area of said second MOSFET is larger in surface area than that of the second major surface area of said first MOSFET.
   18. The buck converter circuit organization of claim 17, wherein both said first and second MOSFETs are n-type MOSFETs.
   19. A buck converter circuit organization, comprising:
   a first vertical MOSFET having at least a first major surface area thereof defining a source contact surface and having a second major surface area thereof defining a drain contact surface and having a gate contact for controlling current conduction in said first MOSFET in response to a gate control voltage applied to said gate contact of said first MOSFET, the first major surface area of said first MOSFET connected to a circuit ground;
   a second vertical MOSFET having at least a first major surface area thereof defining a drain contact surface and having a second major surface area thereof defining a source contact surface connected to a voltage source $V_{in}$ and having a gate contact for controlling current conduction in said second MOSFET in response to a gate control voltage applied to said gate contact of said second MOSFET, the first major surface area of said second MOSFET mounted in a conductive, stacked relationship with said second major surface of said first MOSFET to define a circuit node thereat; and
   a conductive clip electrically connected to said circuit node, said conductive clip electrically connectable to a load via at least an inductive impedance; and
   a driver circuit connected to said gate contact of said first MOSFET and connected to said gate contact of said second MOSFET for providing pulses of selected time and pulse width to the respective gate contacts of said first and second MOSFETs to control the voltage at said circuit node.
   20. The buck converter circuit organization of claim 19, wherein the first major surface area of said second MOSFET and said second major surface of said first MOSFET are mounted in a surface-to-surface conductive relationship to define said circuit node thereat.
   21. The buck converter circuit organization of claim 20, wherein the first major surface area of said second MOSFET is smaller than said second major surface of said first MOSFET, said conductive clip electrically connected to a portion of the second surface area of said first MOSFET not occupied by said second MOSFET.
   22. The buck converter circuit organization of claim 19, wherein the first major surface area of said second MOSFET is conductively mounted on a surface area portion of said conductive clip and said second major surface of said first MOSFET is conductively mounted to another surface area portion of said conductive clip;
   said conductive clip defining a circuit node thereat.
   23. The buck converter circuit organization of claim 19, wherein the first major surface area of said second MOSFET is larger in surface area than that of the second major surface area of said first MOSFET.
   24. The buck converter circuit organization of claim 19, wherein said first MOSFET is an n-type MOSFET and said second MOSFETs is a p-type MOSFET.
   25. A method of manufacturing a power converter, the method comprising:
   mounting a first die containing a first vertical transistor on a die pad;
   coupling the die pad to a first trace on a printed circuit board;
   mounting a second die containing a second vertical transistor over the first die, the second vertical transistor having a drain contact in a bottom surface of the second die, the drain contact electrically coupled to a source contact in a top surface of the first vertical transistor and defining a phase node of the power converter;
   coupling an inductor via a conductor to the phase node;

coupling the second vertical transistor to a second trace on the printed circuit board; and coupling a gate of each of the first and second vertical transistors to a driver of the power converter.

26. The method of claim 25, wherein mounting a first die comprises mounting the first die having a high side field effect transistor (FET) in a bottom drain/top source orientation.

27. The method of claim 26, wherein mounting a second die comprises mounting the second die having a low side FET in a bottom drain/top source orientation such that a source of the high side FET is coupled to a drain of the low side FET at the phase node.

28. The method of claim 25, wherein coupling the die pad to a first trace comprises coupling the die pad to one of a ground trace and an input voltage trace.

29. The method of claim 25, wherein coupling the inductor via the conductor comprises coupling the inductor via one of a shape sustaining clip, a conductive ribbon or a strap.

30. The method of claim 25, wherein coupling the second vertical transistor to a second trace comprises coupling the second vertical transistor to one of a ground trace and an input voltage trace.

31. A circuit for a power converter, the circuit comprising:
a first semiconductor die having a first vertical transistor formed therein;
a second semiconductor die having a second vertical transistor formed therein;
wherein the first semiconductor die is mounted over the second semiconductor die;
wherein the first and second semiconductor dies have different surface areas;
wherein the first and second vertical transistors are coupled in series between an input voltage and a reference potential; and
a phase node at a junction between the first and second vertical transistors.

32. The circuit of claim 31, wherein:
the first semiconductor die has a drain of the first vertical transistor on a first major surface and a source of the first vertical transistor on a second, opposite major surface; and the second semiconductor die has a drain of the second vertical transistor on a first major surface and a source of the second vertical transistor on a second, opposite major surface.

33. The circuit of claim 31, wherein the drain of the first vertical transistor is coupled to the source of the second vertical transistor.

34. The circuit of claim 31, wherein the drain of the first vertical transistor is coupled to the drain of the second vertical transistor.

35. The circuit of claim 31, and further comprising a conductive clip disposed between the first and second semiconductor dies, and wherein the conductive clip provides the phase node.

36. A power converter, comprising:
a first semiconductor die having a first vertical transistor formed therein, the first vertical transistor having a source region formed on a first surface of the first semiconductor die and a drain region formed on a second, opposite surface of the first semiconductor die, and a gate contact;
a second semiconductor die having a second vertical transistor formed therein, the second vertical transistor having a source region formed on a first surface of the second semiconductor die and a drain region formed on a second, opposite surface of the second semiconductor die, and a gate contact;
wherein the first semiconductor die is mounted over the second semiconductor die;
wherein the first and second vertical transistors are coupled in series between an input voltage and a reference potential;
a phase node at a junction between the first and second vertical transistors, the phase node connectable to a load via at least one inductive impedance; and
a driver circuit, coupled to the gate contacts of the first and second vertical transistors, to control the voltage provided at the phase node.

37. The power converter of claim 36, wherein the phase node comprises a conductive clip coupled between the first and second semiconductor dies.

* * * * *